United States Patent
Cho et al.

(10) Patent No.: US 8,105,697 B2
(45) Date of Patent: Jan. 31, 2012

(54) POLYMER MEMORY DEVICE AND METHOD OF FORMING THE SAME

(75) Inventors: Byeong-Ok Cho, Seoul (KR); Takahiro Yasue, Suwon-si (KR); Moon-Sook Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 1155 days.

(21) Appl. No.: 11/905,510

(22) Filed: Oct. 2, 2007

(65) Prior Publication Data

US 2008/0131712 A1  Jun. 5, 2008

(30) Foreign Application Priority Data

Oct. 2, 2006  (KR) .............. 10-2006-97324

(51) Int. Cl.
*B21D 39/00* (2006.01)
*B32B 9/02* (2006.01)
(52) U.S. Cl. ...................... 428/624; 428/458
(58) Field of Classification Search .......... 428/458, 428/624, 546
See application file for complete search history.

(56) References Cited

U.S. PATENT DOCUMENTS

| | | | | |
|---|---|---|---|---|
| 5,178,964 A | * | 1/1993 | Scola et al. | 428/473.5 |
| 7,635,855 B2 | * | 12/2009 | Chen et al. | 257/4 |
| 2005/0006643 A1 | | 1/2005 | Lan et al. | |
| 2007/0017571 A1 | * | 1/2007 | Gaudiana et al. | 136/263 |
| 2007/0164272 A1 | * | 7/2007 | Yang et al. | 257/40 |

FOREIGN PATENT DOCUMENTS

| | | |
|---|---|---|
| JP | 2004-513513 | 4/2004 |
| KR | 10-2004-0051614 | 6/2004 |
| KR | 10-2005-0016580 | 2/2005 |
| KR | 10-2006-0028743 | 3/2006 |
| KR | 1020060089536 A | 8/2006 |
| WO | 0036893 * | 6/2000 |
| WO | WO 02/37500 | 5/2002 |
| WO | WO 2005/011014 | 2/2005 |

* cited by examiner

*Primary Examiner* — Kevin R. Kruer
(74) *Attorney, Agent, or Firm* — Harness, Dickey & Pierce, P.L.C.

(57) ABSTRACT

Provided is a polymer memory device and a method of forming the same. The polymer memory device may include a first electrode, a first curable polymer layer, a second electrode, a second curable polymer layer, and a third electrode. The first electrode may be disposed on a substrate. The first curable polymer layer may cover the first electrode. The second electrode may be disposed on the first curable polymer layer and cross over the first electrode. The second curable polymer layer may cover the second electrode. The third electrode may be disposed on the second curable polymer layer and cross over the second electrode. Each of the first curable polymer layer and the second curable polymer layer may contain a fullerene or a fullerene derivative.

12 Claims, 10 Drawing Sheets

POLYMER MEMORY DEVICE AND METHOD OF FORMING THE SAME

CROSS-REFERENCE TO RELATED APPLICATIONS

This U.S. non-provisional patent application claims the benefit of priority under 35 U.S.C. §119 of Korean Patent Application No. 10-2006-97324, filed on Oct. 2, 2006, the entire contents of which are hereby incorporated by reference.

BACKGROUND

Typically, semiconductor memory devices may be fabricated using an inorganic material such as silicon. However, when semiconductor memory devices are fabricated using inorganic material, the fabrication process may become more difficult and the fabrication cost may increase greatly with the higher integration of the semiconductor memory devices.

Recently, a polymer memory device is being proposed to overcome the above limitations. The polymer memory device may include a polymer layer that may be disposed between an upper metal electrode and a lower metal electrode. The electrical characteristics of the polymer layer may vary depending on an electric field between the upper and lower metal electrodes. A variety of memory devices using the variable electrical characteristics are being proposed.

The polymer layer, which may be used as a data storage element in the polymer memory device, may be formed using a simple and inexpensive process such as spin coating or printing. However, it may be difficult to achieve a high integration polymer memory device because, for example, when polymer layers are stacked, a lower polymer layer may be dissolved and damaged by solvents used when forming an upper polymer layer.

SUMMARY

Example embodiments may provide a high-integration polymer memory device and a method of forming the same.

According to example embodiments, the polymer memory device may include a first electrode on a substrate, a first curable polymer layer that may cover the first electrode, a second electrode on the first curable polymer layer and crossing over the first electrode, a second curable polymer layer that may cover the second electrode and a third electrode on the second curable polymer layer and crossing over the second electrode. Each of the first curable polymer layer and the second curable polymer layer may contain a fullerene or fullerene derivative.

In example embodiments, each of the first curable polymer layer and the second curable polymer layer may include a polyimide layer. The polyimide layer may include a BPDA-PPD (4,4'-biphthalic dianhydride p-phenylene diamine) polyimide layer, for example. The fullerene derivative may contain PCBM ([6,6]-phenyl C61 butyric acid methyl ester), for example.

According to example embodiments, the polymer memory device may include a first electrode on a substrate, a first curable polymer layer that may cover the first electrode, a second electrode on the first curable polymer layer and crossing over the first electrode, an insulating layer that may cover the second electrode, a third electrode on the insulating layer and crossing over the second electrode, a second curable polymer layer that may cover the third electrode, and a fourth electrode on the second curable polymer layer and crossing over the third electrode. Each of the first curable polymer layer and the second curable polymer layer may contain a fullerene or a fullerene derivative.

In example embodiments, the insulating layer may contain a third curable polymer layer. The insulating layer may include a third curable polymer layer that may not contain the fullerene or the fullerene derivative. The insulating layer may include an inorganic insulating layer. Each of the first curable polymer layer, the second curable polymer layer, and the third curable polymer layer may include a polyimide layer. The polyimide layer may include a BPDA-PPD (4,4'-biphthalic dianhydride p-phenylene diamine) polyimide layer, for example. The fullerene derivative may contain PCBM ([6,6]-phenyl C61 butyric acid methyl ester), for example.

According to example embodiments, an example method of forming a polymer memory device may include forming a first electrode on a substrate forming a first curable polymer layer that may cover the first electrode, forming a second electrode that is on the first curable polymer layer and crosses over the first electrode, forming a second curable polymer layer that may cover the second electrode, and forming a third electrode that is on the second curable polymer layer and crosses over the second electrode. Each of the first curable polymer layer and the second curable polymer layer may contain a fullerene or a fullerene derivative.

In example embodiments, forming the first curable polymer layer may include: forming a first polyamic acid layer that may cover the first electrode and contain the fullerene or the fullerene derivative, and curing the first polyamic acid layer to form a first polyimide layer. Forming the second curable polymer layer may include forming a second polyamic acid layer that may cover the second electrode and contain the fullerene or the fullerene derivative, and curing the second polyamic acid layer to form a second polyimide layer. Each of the first polyamic acid layer and the second polyamic acid layer may include a BPDA-PPD (4,4'-biphthalic dianhydride p-phenylene diamine) polyamic acid layer, for example. The curing process may include a heating process, a photon process, an ultraviolet process, an electron bean process, or an ion beam process, for example. The fullerene derivative may contain PCBM ([6,6]-phenyl C61 butyric acid methyl ester), for example.

According to example embodiments, an example method of forming a polymer memory device may include forming a first electrode on a substrate, forming a first curable polymer layer that may cover the first electrode, forming a second electrode that is on the first curable polymer layer and crosses over the first electrode, forming an insulating layer that may cover the second electrode, forming a third electrode that is on the insulating layer and crosses over the second electrode, forming a second curable polymer layer that may cover the third electrode, and forming a fourth electrode that is on the second curable polymer layer and crosses over the third electrode. Each of the first curable polymer layer and the second curable polymer layer may contain a fullerene or a fullerene derivative.

In example embodiments, forming the insulating layer may include forming an inorganic insulating layer. Forming the insulating layer may include forming a third curable polymer layer that may not contain the fullerene or the fullerene derivative. Forming the first curable polymer layer may include forming a first polyamic acid layer that may cover the first electrode and may contain the fullerene or the fullerene derivative, and curing the first polyamic acid layer to form a first polyimide layer. Forming the third curable polymer layer may include forming a third polyamic acid layer that may cover the second electrode and may not contain the fullerene or the fullerene derivative, and curing the third polyamic acid layer to form a third polyimide layer. Forming the second curable polymer layer may include forming a second polyamic acid layer that may cover the third electrode and may contain the fullerene or the fullerene derivative, and curing the second polyamic acid layer to form a second polyimide layer. Each of the first polyamic acid layer and the second polyamic acid layer may include a BPDA-PPD (4,4'-biphthalic dianhydride p-phenylene diamine) polyamic acid layer, for example. The curing process may include a heating process, a photon process, an ultraviolet process, an electron bean process, or an ion beam process, for example. The fullerene derivative may contain PCBM ([6,6]-phenyl C61 butyric acid methyl ester), for example.

BRIEF DESCRIPTION OF THE FIGURES

The accompanying figures are included to provide a further understanding of example embodiments, and are incorporated in and constitute a part of this specification. The drawings, together with the description, serve to explain principles of example embodiments. In the figures.

DETAILED DESCRIPTION OF EXAMPLE EMBODIMENTS

Figure 1:
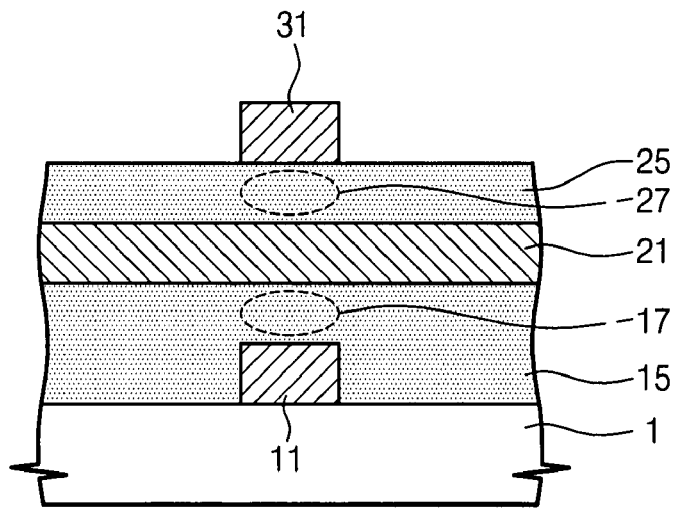
FIG. 1 is a sectional view of a polymer memory device according to an example embodiment.

Example embodiments will be described below in more detail with reference to the accompanying drawings. The example embodiments may, however, be embodied in different forms and should not be construed as limited to example embodiments set forth herein. Rather, example embodiments are provided so that this disclosure will be thorough and complete, and will fully convey the scope of the example embodiments to those skilled in the art.

It will be understood that although the terms first and second are used herein to describe various elements, these elements should not be limited by these terms. These terms are only used to distinguish one element from another element. It will also be understood that when a layer (or film) is referred to as being 'on' another layer or substrate, it can be directly on the other layer or substrate, or intervening layers may also be present. In the figures, the dimensions of layers and regions are exaggerated for clarity of illustration. While example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a sectional view of a polymer memory device according to example embodiments.

Referring to FIG. 1, a first electrode 11 and a first curable polymer layer 15 covering the first electrode 11 may be disposed on a substrate 1. A second electrode 21 crossing over the first electrode 11 and a second curable polymer layer 25 covering the second electrode 21 may be disposed on the first curable polymer layer 15. A third electrode 31 crossing over the second electrode 21 may be disposed on the second curable polymer layer 25.

The first, second and third electrodes 11, 21 and 31 may contain metallic material (e.g., aluminum). The first, second and third electrodes 11, 21 and 31 may be disposed in various arrangements. For example, the vertically adjacent electrodes may be perpendicular to each other or may be inclined by 45° with respect to each other.

Each of the first and second curable polymer layers 15 and 25 may contain thermosetting resin, light-curable resin, ultraviolet (UV)-curable resin, electron beam-curable resin, or ion beam-curable resin that may contain a fullerene or a fullerene derivative. For example, each of the first and second curable polymer layers 15 and 25 may include a polyimide layer. The polyimide layer may include a BPDA-PPD (4,4'-biphthalic dianhydride p-phenylene diamine) polyimide layer. For example, the fullerene derivative may include PCBM ([6,6]-phenyl C61 butyric acid methyl ester).

The first curable polymer layer 15 may include a first data storage area 17 between the first and second electrodes 11 and 21, and the second curable polymer layer 25 may include a second data storage area 27 between the second and third electrodes 21 and 31. When a ground voltage or a bias voltage is supplied to each of the electrodes 11, 21 and 31, the resistance of each of the data storage areas 17 and 27 may be changed, so that a program operation may be performed or a data read operation may be performed on the data storage areas 17 and 27.

Figure 17A:
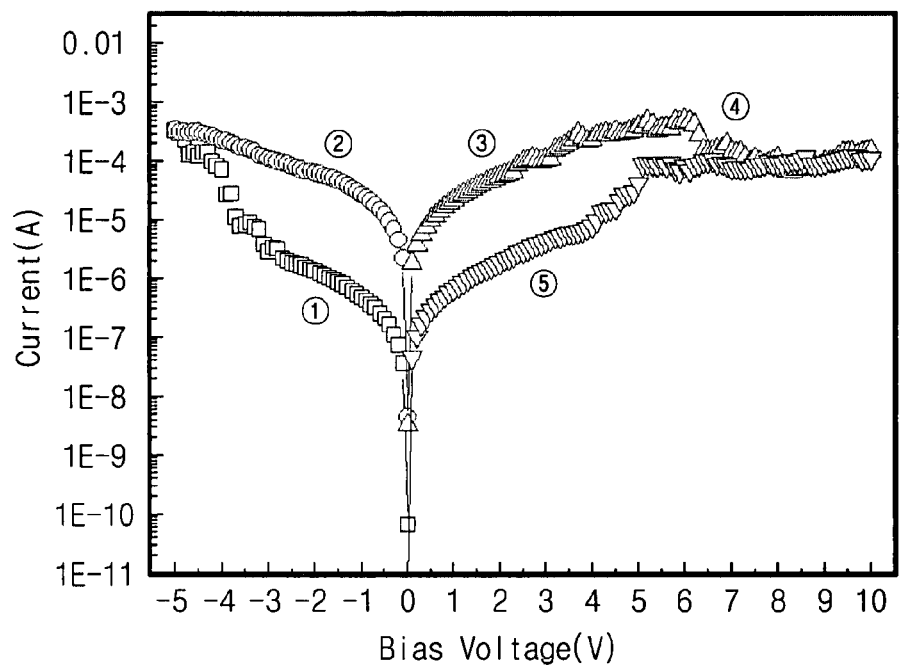
FIGS. 17A through 18B are example graphs illustrating the operation characteristics of a polymer memory device according to example embodiments.
Figure 17B:
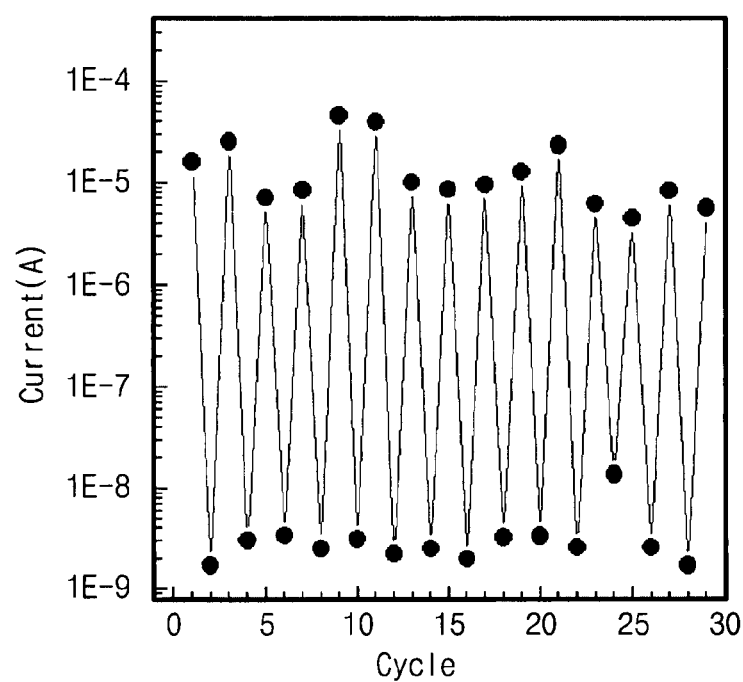

FIGS. 17A through 18B are example graphs illustrating the operation characteristics of a polymer memory device according to example embodiments. FIGS. 17A and 17B relate to the first data storage area 17, and FIGS. 18A and 18B relate to the second data storage area 27. A ground voltage or a bias voltage may be supplied to the first, second and third electrodes 11, 21 and 31. For example, a ground voltage may be supplied to the first and third electrodes 11 and 31, and a bias voltage may be supplied to the second electrode 21. Alternatively, a bias voltage may be supplied to the first and third electrodes 11 and 31, and a ground voltage may be supplied to the second electrode 21. Any combination of voltages may be supplied to the first, second and third electrodes 11, 21 and 31.

Referring to FIGS. 1 and 17A, a ground voltage may be supplied to the first electrode 11, and a bias voltage may be supplied to the second electrode 21. In FIG. 17A, the axis of abscissas represents the strength of an applied bias voltage, and the axis of ordinates represents the strength of a current flowing through the first data storage area 17. When the bias voltage increases negatively from 0V, the current may increase along a path ① and then increase abruptly from the point of about −3 V bias voltage, so that the first data storage area 17 may switch from an off state to an on state. When the bias voltage again increases negatively from 0V after an interruption of a power supply, the current may increase along a path ②. When the bias voltage increases positively from 0V after re-interruption of the power supply, the current may increase along a path ③ and then decrease along a path ④ after the point of about 4~5 V bias voltage, so that the first data storage area 17 may switch from an on state to an off state. When the bias voltage again increases positively from 0V after re-interruption of the power supply, the current may increase along a path ⑤. As described above, depending on the supplied bias voltage, the first data storage area 17 may change resistance and thus may switch from an off state to an on state or from an on state to an off state. These operation characteristics show that the polymer memory device may be used as a nonvolatile memory device. In addition, it may be seen from FIG. 17B that the first data storage area 17 maintains the operation characteristics constantly even when the switching process is performed repeatedly.

Figure 18A:
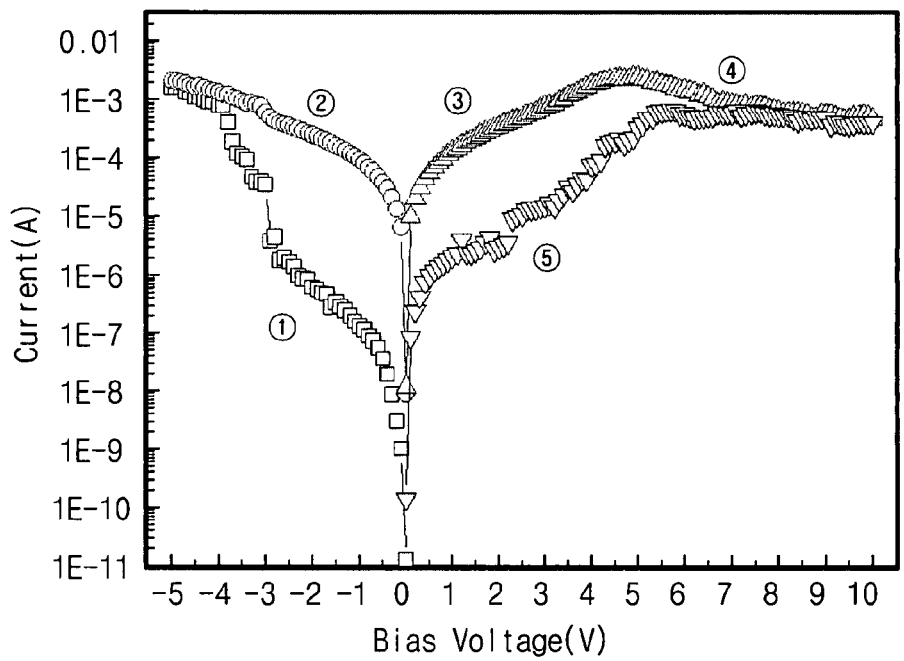
Figure 18B:
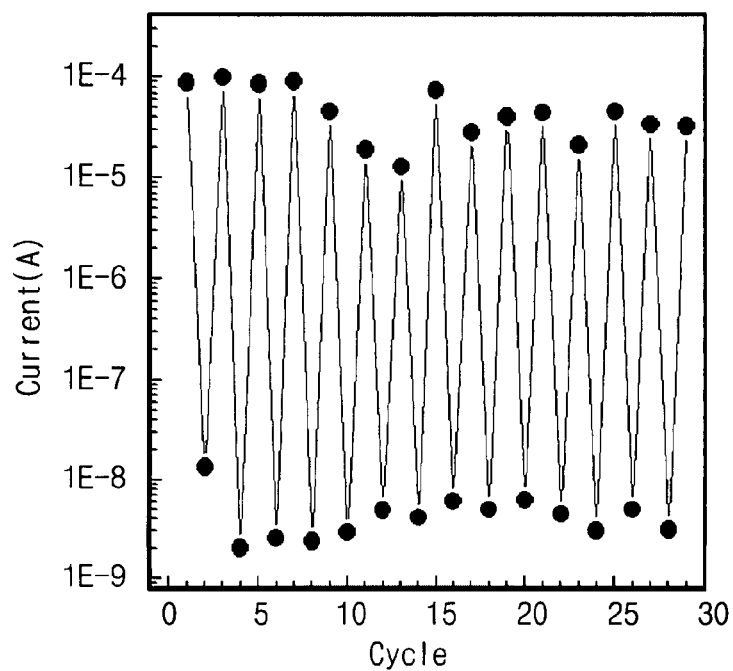

Referring to FIGS. 1 and 18A, a ground voltage may be supplied to the second electrode 21, and a bias voltage may be supplied to the third electrode 31. In FIG. 18A, the axis of abscissas represents the strength of an applied bias voltage, and the axis of ordinates represents the strength of a current flowing through the second data storage area 27. When the bias voltage increases negatively from 0V, the current may increase along a path ① and then increase abruptly from the point of about −3 V bias voltage, so that the second data storage area 27 may switch from an off state to an on state. When the bias voltage again increases negatively from 0V after an interruption of a power supply, the current may increase along a path ②. When the bias voltage increases positively from 0V after re-interruption of the power supply, the current may increase along a path ③ and then decrease along a path ④ after the point of about 4~5 V bias voltage, so that the second data storage area 27 may switch from an on state to an off state. When the bias voltage again increases positively from 0V after re-interruption of the power supply, the current may increase along a path ⑤. That is, the second data storage area 27 shows the same operation characteristics as the first data storage area 17. In addition, it may be seen from FIG. 18B that the second data storage area 27 maintains the operation characteristics constantly even when the switching process is performed repeatedly. Thus, a stable data storage area may be achieved even when the curable polymer layers are stacked.

Figure 2:
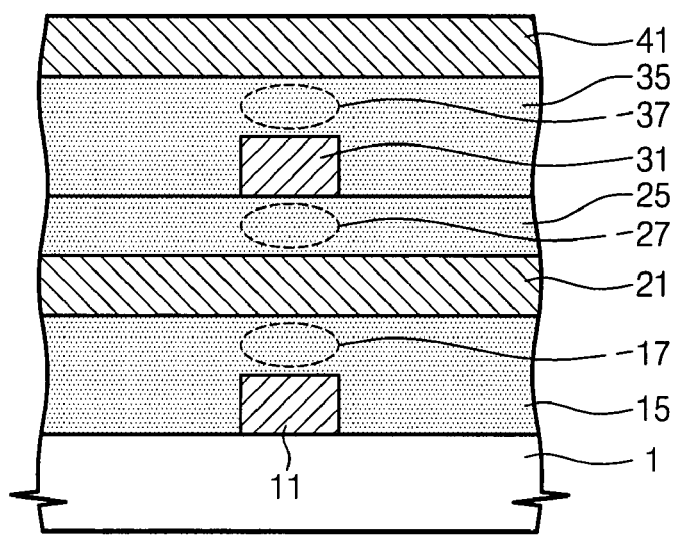
FIGS. 2 through 4 are sectional views of polymer memory devices according to an example embodiment.
Figure 3:
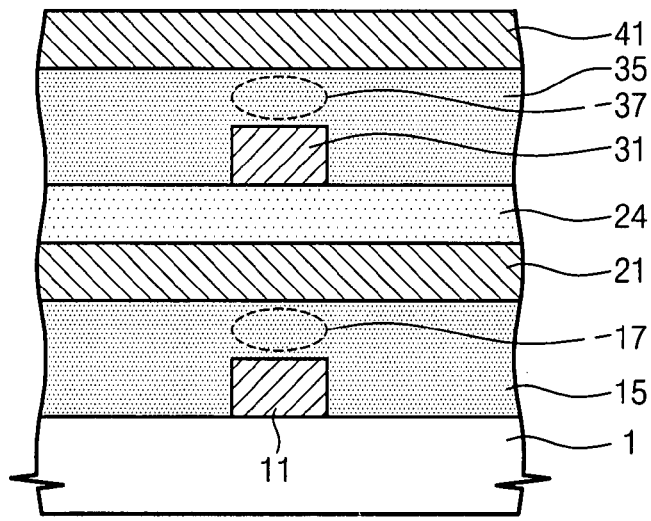
Figure 4:
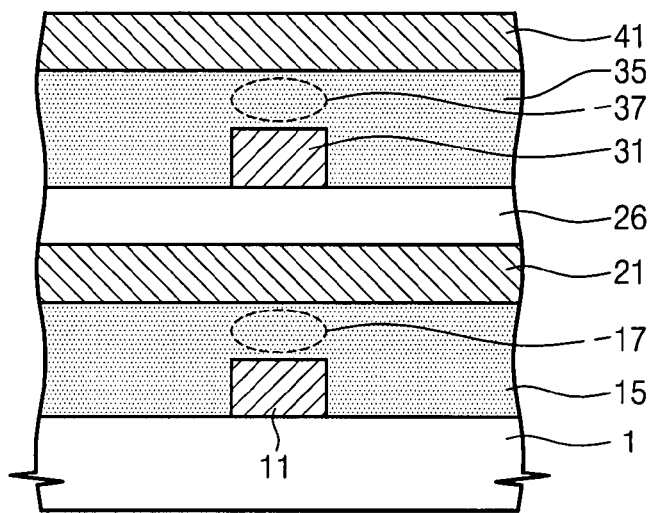

FIGS. 2 through 4 are sectional views of polymer memory devices according to example embodiments. A description of the features as in FIG. 1 is omitted for conciseness.

Referring to FIG. 2, a third curable polymer layer 35 covering the third electrode 31 may be disposed on the second curable polymer layer 25. A fourth electrode 41 crossing over the third electrode 31 may be disposed on the third curable polymer layer 35.

The third curable polymer layer 35 may contain thermosetting resin, light-curable resin, UV-curable resin, electron beam-curable resin, or ion beam-curable resin that contains a fullerene or a fullerene derivative. For example, the third curable polymer layers 35 may include a polyimide layer. The polyimide layer may include a BPDA-PPD (4,4'-biphthalic dianhydride p-phenylene diamine) polyimide layer. For example, the fullerene derivative may include PCBM ([6,6]-phenyl C61 butyric acid methyl ester).

The third curable polymer layer 35 may include a third data storage area 37 between the third and fourth electrodes 31 and 41. Therefore, the polymer memory device may include three data storage areas and its integration level may be further increased.

Referring to FIG. 3, a second curable polymer layer 24 may not contain a fullerene or a fullerene derivative. Therefore, the second curable polymer layer 24 may not include a data storage area and thus may serve as an insulating layer that insulates the second electrode 21 and the third electrode 31 from each other. When compared to the FIG. 2 embodiment, the number of the data storage areas may decrease by 1, but the first data storage area 17 and the third data storage area 37 may operate more stably.

Referring to FIG. 4, an inorganic insulating layer 26 may be disposed instead of the second curable polymer layer 24 as shown in the FIG. 3. The inorganic insulating layer 26 may include a silicon oxide ($SiO_2$) layer, a silicon oxide nitride (SiON) layer, a silicon nitride (SiN) layer, or an aluminum oxide ($Al_2O_3$) layer. The number of the data storage areas may decrease by 1, but the first data storage area 17 and the third data storage area 37 may operate more stably.

According to example embodiments, the polymer memory device may be arranged vertically and may include two or more data storage areas with stable operation characteristics. Accordingly, a high-integration polymer memory device may be implemented.

FIGS. 5 through 19 are sectional views illustrating an example method of forming a polymer memory device according to example embodiments.

Figure 5:
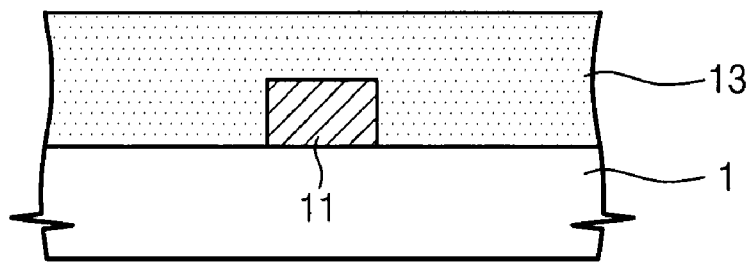
FIGS. 5 through 10 are sectional views illustrating an example method of forming a polymer memory device according to an example embodiment.

Referring to FIG. 5, a first electrode 11 may be formed on a substrate 1. The first electrode 11 may be formed of metallic material (e.g., aluminum). A first precursor polymer layer 13 may cover the first electrode 11 and be formed on the substrate 1. For example, the first precursor polymer layer 13 may be formed of polyamic acid containing a fullerene or a fullerene derivative. The fullerene derivative may include PCBM ([6,6]-phenyl C61 butyric acid methyl ester), for example. The polyamic acid may include BPDA-PPD (4,4'-biphthalic dianhydride p-phenylene diamine) polyamic acid, for example.

Figure 6:
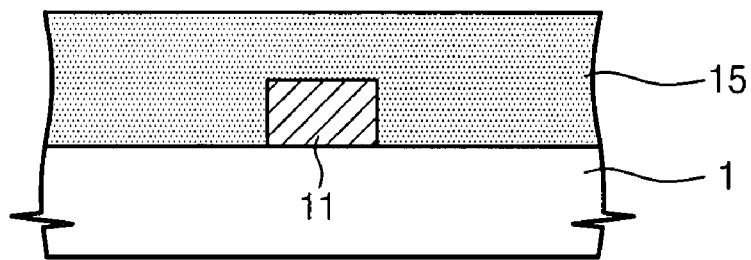

Referring to FIG. 6, the first precursor polymer layer 13 may be cured to form a first curable polymer layer 15. For example, the curing process may include a heating process, a photon process, a UV process, an electron beam process, or an ion beam process. For example, the polyamic acid may be cured by the curing process into curable resin. Reaction Equation (1) shows that the BPDA-PPD polyamic acid may change into a BPDA-PPD polyimide after removal of water molecules by the heating process.

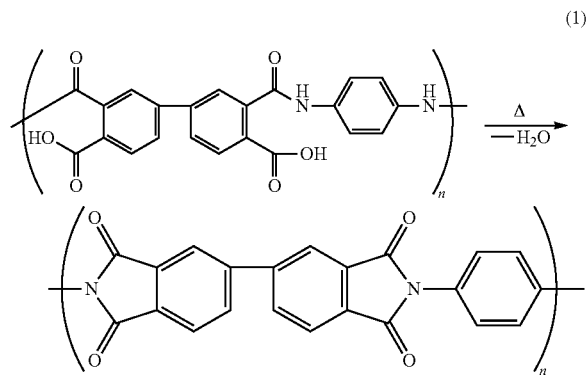

(1)

Figure 7:
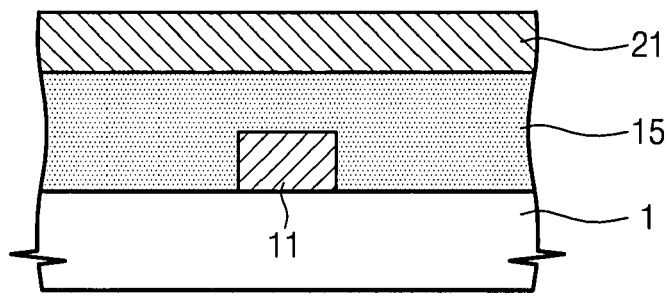
Figure 8:
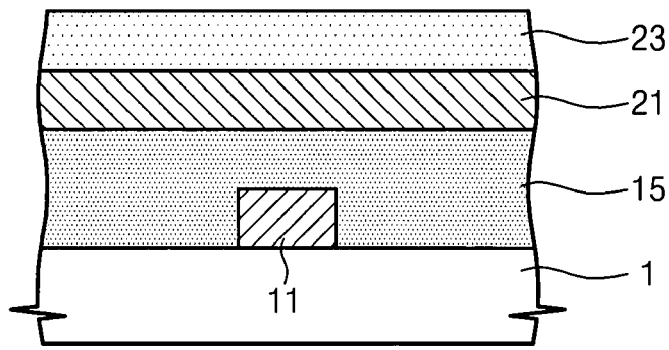
Figure 9:
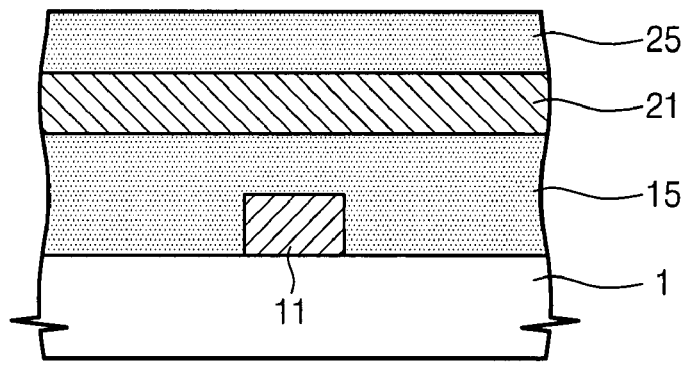

Referring to FIGS. 7-9, a second electrode 21 may be formed on the first curable polymer layer 15. The second electrode 21 may be formed of metallic material (e.g., aluminum). A second precursor polymer layer 23 may cover the second electrode 21 and may be formed-on the first curable polymer layer 15. For example, the second precursor polymer layer 23 may be formed of polyamic acid containing a fullerene or a fullerene derivative. The second precursor polymer layer 23 may be cured to form a second curable polymer layer 25. Because a lower layer under the second precursor polymer layer 23 may be the first curable polymer layer 15, the lower layer may not be damaged when the second precursor polymer layer 23 is formed using the polyamic acid. Thus, there is no need to form a protective layer on the first curable polymer layer 15 before the forming of the second curable polymer layer 25. Therefore, the stack-type polymer memory device may be formed by a simple process.

Figure 10:
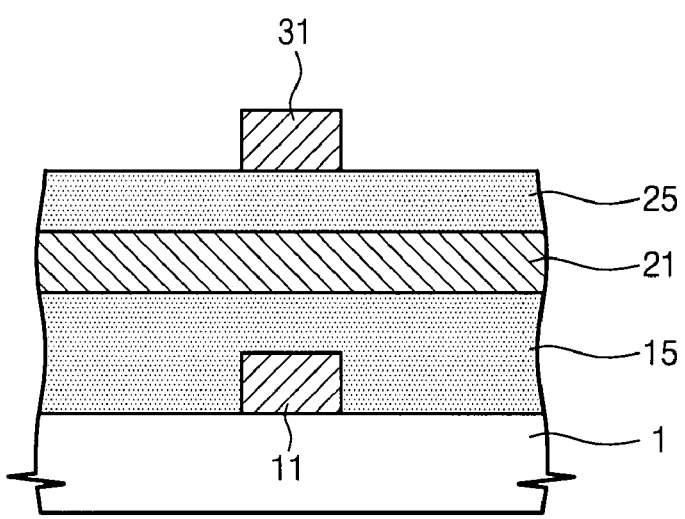

Referring to FIG. 10, a third electrode 31 may be formed on the second curable polymer layer 25. The third electrode 31 may be formed of metallic material (e.g., aluminum).

FIGS. 11 through 16 are sectional views illustrating example methods of forming polymer memory devices according to example embodiments. A description of the overlap with the above-described example embodiments are omitted for conciseness.

Figure 11:
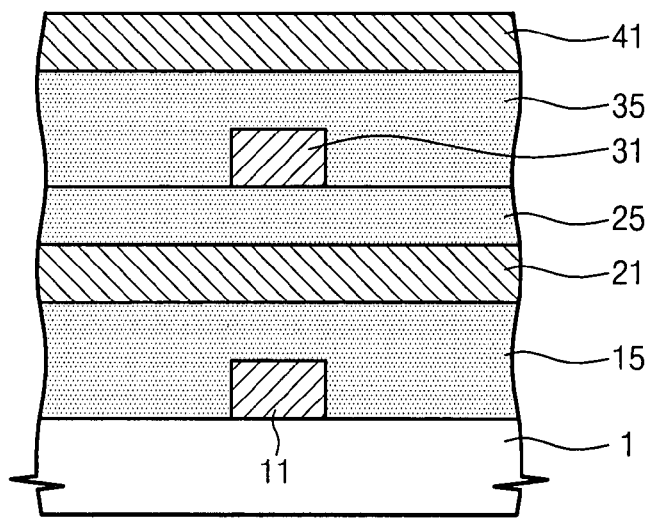
FIGS. 11 through 16 are sectional views illustrating example methods of forming polymer memory devices according to example embodiments.

Referring to FIG. 11, a third curable polymer layer 35 may cover the third electrode 31 and may be formed on the second curable polymer layer 25. A fourth electrode 41 crossing over the third electrode 31 may be formed on the third curable polymer layer 35.

The third curable polymer layer 35 may be formed in a similar manner as the first and second curable polymer layers 15 and 25. The fourth electrode 41 may be formed of metallic material (e.g., aluminum).

In example embodiments, the third curable polymer layer 35 may be stably formed on the second curable polymer layer 25. Accordingly, it may be possible to form a more highly integrated polymer memory device.

Figure 12:
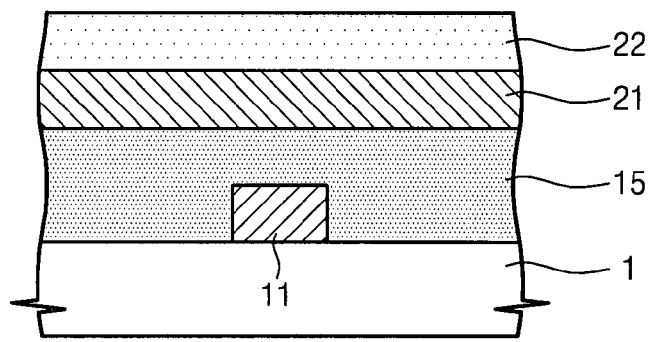
Figure 13:
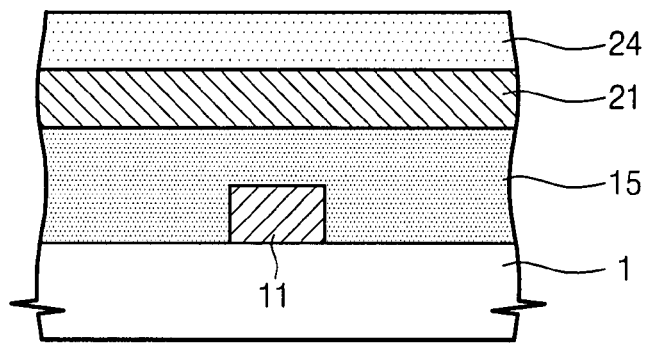
Figure 14:
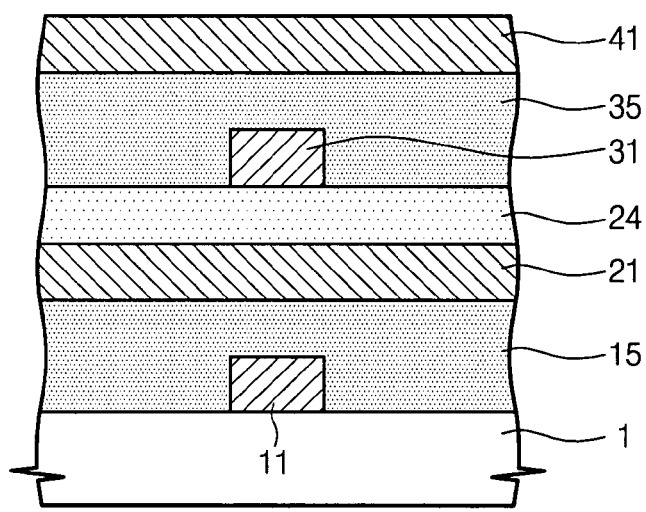

Referring to FIGS. 12 through 14, a second precursor polymer layer 22 may cover a second electrode 21 and may be formed on a first curable polymer layer 15. The second precursor polymer layer 22 may not contain a fullerene or a fullerene derivative.

The second precursor polymer layer 22 may be cured to form a second curable polymer layer 24. Because the second curable polymer layer 24 may not contain a fullerene or a fullerene derivative, it may not include a data storage area. Thus, the second curable polymer layer 24 may serve as an insulating layer that insulates the second electrode 21 and a third electrode 31 from each other. Accordingly, it may be possible to form a polymer memory device that may operate more stably.

Referring to FIG. 14, a third curable polymer layer 35 covering a third electrode 31 may be disposed on the second curable polymer layer 24. A fourth electrode 41 crossing over the third electrode 31 may be disposed on the third curable polymer layer 35.

The third curable polymer layer 35 may contain thermosetting resin, light-curable resin, UV-curable resin, electron beam-curable resin, or ion beam-curable resin that contains a fullerene or a fullerene derivative. For example, the third curable polymer layers 35 may include a polyimide layer. The polyimide layer may include a BPDA-PPD (4,4'-biphthalic dianhydride p-phenylene diamine) polyimide layer. For example, the fullerene derivative may include PCBM ([6,6]-phenyl C61 butyric acid methyl ester).

Figure 15:
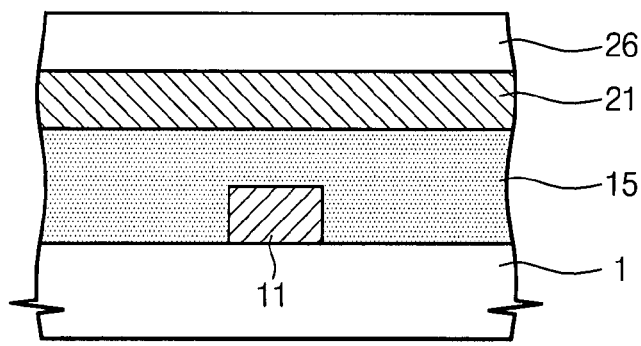
Figure 16:
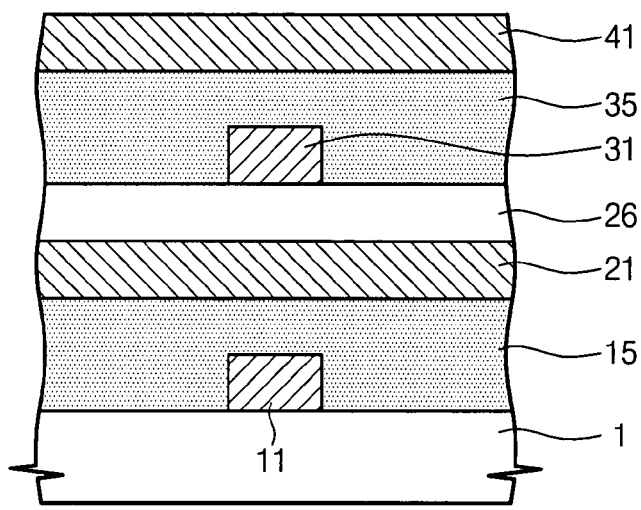

Referring to FIGS. 15 and 16, an inorganic insulating layer 26 may cover a second electrode 21 and may be formed on a first curable polymer layer 15. A third electrode 31 and a third curable polymer layer 35 may cover the third electrode 31 and may be formed on the inorganic insulating layer 26. The inorganic insulating layer 26 may connect the first electrode 21 and the third electrode 31. For example, the inorganic insulating layer 26 may be formed of a silicon oxide ($SiO_2$) layer, a silicon oxide nitride (SiON) layer, a silicon nitride (SiN) layer, or an aluminum oxide ($Al_2O_3$) layer. Accordingly, it may be possible to form a polymer memory device that may operate more stably.

As described above, the curable polymer layers may be stacked such that two or more data storage areas may be disposed vertically. Accordingly, it may be possible to implement a high-integration polymer memory device.

The above-disclosed subject matter is to be considered illustrative, and not restrictive, and the appended claims are intended to cover all such modifications and enhancements which may fall within the true spirit and scope of the example embodiments. Thus, to the maximum extent allowed by law, the scope of the example embodiments is to be determined by the broadest permissible interpretation of the following claims and their equivalents, and shall not be restricted or limited by the foregoing detailed description of example embodiments.

What is claimed is:

1. A polymer memory device, comprising:
   a first electrode on a substrate;
   a first curable polymer layer covering the first electrode;
   a second electrode on the first curable polymer layer and crossing over the first electrode;
   a second curable polymer layer covering the second electrode;
   a third electrode on the second curable polymer layer and crossing over the second electrode;
   a third curable polymer layer covering the third electrode, the third curable polymer layer having a data storage area; and
   a fourth electrode on the third curable polymer layer and crossing over the third electrode, wherein the first curable polymer layer, the second curable polymer layer and the third curable polymer layer contain at least one of a fullerene and a fullerene derivative.

2. The polymer memory device of claim 1, wherein the first curable polymer layer and the second curable polymer layer includes a polyimide layer.

3. The polymer memory device of claim 2, wherein the polyimide layer includes a BPDA-PPD (4,4'-biphthalic dianhydride p-phenylene diamine) polyimide layer.

4. The polymer memory device of claim 1, wherein the fullerene derivative contains PCBM ([6,6]-phenyl C61 butyric acid methyl ester).

5. A polymer memory device, comprising:
a first electrode on a substrate;
a first curable polymer layer covering the first electrode;
a second electrode on the first curable polymer layer and crossing over the first electrode;
an insulating layer covering the second electrode;
a third electrode on the insulating layer and crossing over the second electrode;
a second curable polymer layer covering the third electrode; and
a fourth electrode on the second curable polymer layer and crossing over the third electrode, wherein
the first curable polymer layer and the second curable polymer layer contain at least one of a fullerene and a fullerene derivative, and
the insulating layer includes a third curable polymer layer, and the first curable polymer layer, the second curable polymer layer, and the third curable polymer layer include a polyimide layer.

6. The polymer memory device of claim 5, wherein the insulating layer includes a third curable polymer layer that does not contain the fullerene or the fullerene derivative.

7. The polymer memory device of claim 5, wherein the insulating layer includes an inorganic insulating layer.

8. The polymer memory device of claim 5, wherein the polyimide layer includes a BPDA-PPD (4,4'-biphthalic dianhydride p-phenylene diamine) polyimide layer.

9. The polymer memory device of claim 5, wherein the fullerene derivative contains PCBM ([6,6]-phenyl C61 butyric acid methyl ester).

10. A polymer memory device comprising:
a first electrode on a substrate;
a first curable polymer layer covering the first electrode, the first curable polymer layer having a first data storage area;
a second electrode on the first curable polymer layer and crossing over the first electrode;
a second curable polymer layer covering the second electrode, the second curable polymer layer having a second data storage area;
a third electrode on the second curable polymer layer and crossing over the second electrode;
a third curable polymer layer covering the third electrode, the third curable polymer layer having a third data storage area; and
a fourth electrode on the third curable polymer layer and crossing over the third electrode, wherein the third curable polymer layer contains at least one of a fullerene and a fullerene derivative,
wherein the first curable polymer layer and the second curable polymer layer contain at least one of a fullerene and a fullerene derivative.

11. The polymer memory device of claim 10, wherein the first data storage area is a portion of the first curable polymer layer between the first electrode and the second electrode, and the second data storage area is a portion of the second curable polymer layer between the second electrode and the third electrode.

12. The polymer memory device of claim 10, wherein the third data storage area is a portion of the third curable polymer layer between the third electrode and the forth electrode.

* * * * *